United States Patent
Honda et al.

(10) Patent No.: US 10,164,620 B1
(45) Date of Patent: Dec. 25, 2018

(54) RINGING SUPPRESSION CIRCUIT

(71) Applicants: DENSO CORPORATION, Kariya, Aichi-pref. (JP); SOKEN, INC., Nishio, Aichi-pref. (JP)

(72) Inventors: Takuya Honda, Kariya (JP); Hirofumi Isomura, Kariya (JP); Tomohisa Kishigami, Kariya (JP); Hiroyuki Mori, Nishio (JP); Yasuhiro Mori, Eching (DE); Yuki Horii, Kariya (JP)

(73) Assignees: DENSO CORPORATION, Kariya (JP); SOKEN, INC., Nishio (JP)

( * ) Notice: Subject to any disclaimer, the term of this patent is extended or adjusted under 35 U.S.C. 154(b) by 0 days.

(21) Appl. No.: 15/748,749

(22) PCT Filed: Aug. 25, 2016

(86) PCT No.: PCT/JP2016/074732
§ 371 (c)(1),
(2) Date: Jan. 30, 2018

(87) PCT Pub. No.: WO2017/051654
PCT Pub. Date: Mar. 30, 2017

(30) Foreign Application Priority Data

Sep. 24, 2015 (JP) ................................ 2015-186796
Apr. 13, 2016 (JP) ................................ 2016-080325

(51) Int. Cl.
| | |
|---|---|
| *H03K 5/08* | (2006.01) |
| *H03K 5/1252* | (2006.01) |
| *H03K 3/037* | (2006.01) |
| *H04B 3/20* | (2006.01) |
| *H03K 5/24* | (2006.01) |
| *H03K 5/00* | (2006.01) |

(52) U.S. Cl.
CPC ........... *H03K 5/1252* (2013.01); *H03K 3/037* (2013.01); *H04B 3/20* (2013.01); *H03K 5/24* (2013.01); *H03K 2005/00078* (2013.01)

(58) Field of Classification Search
CPC ........ H03K 5/1252; H03K 5/24; H03K 3/037; H04B 3/20
USPC .................................................. 327/199, 313
See application file for complete search history.

(56) References Cited

U.S. PATENT DOCUMENTS

| | | | |
|---|---|---|---|
| 10,020,841 B2 * | 7/2018 | De Haas | H03K 5/1534 |
| 2012/0293230 A1 * | 11/2012 | Mori | H04L 25/026 |
| | | | 327/313 |
| 2018/0248542 A1 * | 8/2018 | Mori | H03K 5/08 |

FOREIGN PATENT DOCUMENTS

| | | |
|---|---|---|
| JP | 05-091562 A | 4/1993 |
| JP | 2017-050839 A | 3/2017 |
| JP | 2017-063272 A | 3/2017 |

* cited by examiner

*Primary Examiner* — Thomas Skibinski
(74) *Attorney, Agent, or Firm* — Posz Law Group, PLC

(57) ABSTRACT

A ringing suppression circuit, which is connected to a transmission line for transmitting a differential signal changeable between a high level and a low level in a binary level through a pair of a high potential side signal line and a low potential side signal line, and suppresses ringing that occurs in association with transmission of the differential signal, includes: an inter-line switching element that is connected to the pair of the high potential side signal line and the low potential side signal line; and a control unit that turns on the inter-line switching element and fixes an on state when detecting that the differential signal changes from the high level to the low level, and releases the on state after a predetermined time is measured and elapsed.

4 Claims, 20 Drawing Sheets

FIG. 22
PRIOR ART
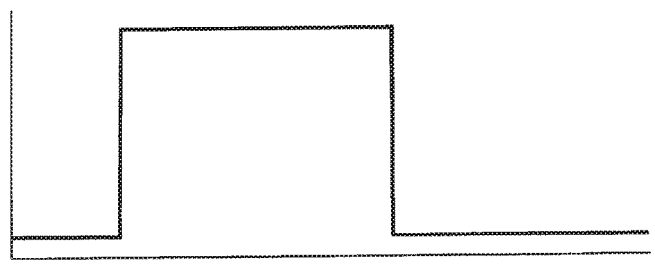
SIGNAL LINE VOLTAGE
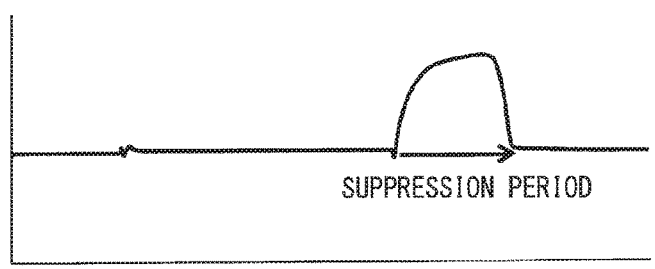
LINE-TO-LINE SWITCHING
ELEMENT GATE
SUPPRESSION PERIOD
FIG. 23
PRIOR ART
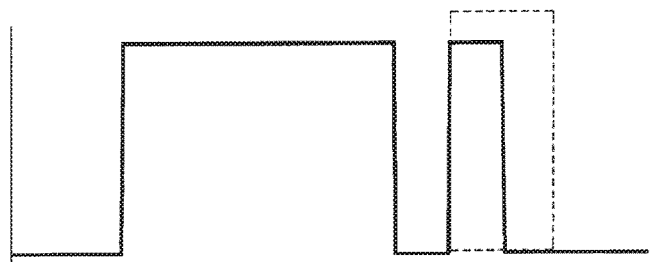
SIGNAL LINE VOLTAGE
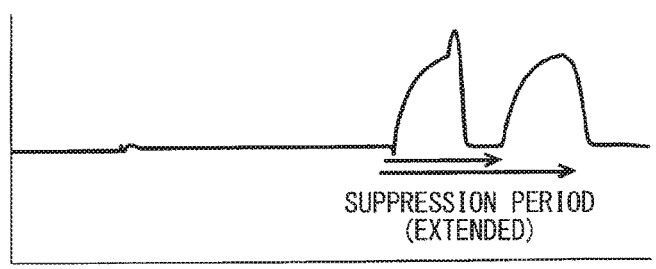
LINE-TO-LINE SWITCHING
ELEMENT GATE
SUPPRESSION PERIOD
(EXTENDED)

RINGING SUPPRESSION CIRCUIT

CROSS REFERENCE TO RELATED APPLICATIONS

This application is the U.S. national phase of International Application No. PCT/JP2016/074732 filed on Aug. 25, 2016 and is based on Japanese Patent Applications No. 2015-186796 filed on Sep. 24, 2015, and No. 2016-80325 filed on Apr. 13, 2016, the disclosures of which are incorporated herein by reference.

TECHNICAL FIELD

The present disclosure relates to a ringing suppression circuit connected to a transmission line that transmits a differential signal.

BACKGROUND

In the case of transmitting a digital signal through a transmission line, part of a signal energy is reflected at the receiving side at a timing when a signal level changes, which leads to a problem that a waveform distortion such as overshoot or undershoot, that is, ringing occurs. Up to now, various techniques for suppressing the waveform distortion have been proposed. For example, as shown in FIG. 22, Patent Literature 1 discloses a technique for suppressing ringing by impedance matching only for a certain period during which a communication is not affected when a voltage level of the transmission line transitions between low and high levels.

In a CAN (Controller Area Network, registered trademark) which is one type of vehicle communications, differential signals of the low level and the high level, that is, data bits are referred to as recessive and dominant, respectively. In this case, as shown in FIG. 23, it is assumed that a ringing waveform changes with large amplitude in order of (1) dominant, (2) recessive, (3) dominant, and (4) recessive.

Then, in a configuration of Patent Literature 1, ringing suppression operation is started in response to a first change from (1) to (2), and when a fixed time has passed, the suppression operation is stopped in the next (3). Then, the ringing suppression operation is resumed in response to a next change to (4). For that reason, a time from the start of the first suppression operation in (2) to the stop after (4) is prolonged. Therefore, when it is assumed that a next bit, that is, the dominant is transmitted during the execution of the suppression operation, a current is drawn and a signal waveform is distorted.

PATENT LITERATURE

Patent Literature 1: Japanese Patent No. 5498527

SUMMARY

It is an object of the present disclosure to provide a ringing suppression circuit capable of always performing ringing suppression operation for a fixed time in response to a level change in a differential signal.

According to a first aspect of the present disclosure, a ringing suppression circuit that is connected to a transmission line for transmitting a differential signal changeable between a high level and a low level in a binary level through a pair of a high potential side signal line and a low potential side signal line, and suppresses ringing that occurs in association with transmission of the differential signal, includes: an inter-line switching element that is connected to the pair of the high potential side signal line and the low potential side signal line; and a control unit that turns on the inter-line switching element and fixes an on state when detecting that the differential signal changes from the high level to the low level, and releases the on state after a predetermined time is measured and elapsed.

According to the ringing suppression circuit described above, when detecting that the differential signal changes from the high level to the low level, the control unit turns on the inter-line switching element to fix the on state, and then releases the on state after having counted a fixed time. With the configuration described above, the on state is fixed once the inter-line switching element is turned on according to the level change of the differential signal. Therefore, even if the level change of the differential signal occurs again thereafter, the inter-line switching element reliably maintains the on state for the fixed time without being affected by the level change of the differential signal. As a result, the ringing suppression period can be prevented from being unnecessarily lengthened, thereby being capable of stably performing the signal transmission.

BRIEF DESCRIPTION OF DRAWINGS

The above and other objects, features and advantages of the present disclosure will become more apparent from the following detailed description made with reference to the accompanying drawings. In the drawings:

FIG. 22 is an operation timing chart corresponding to a part of FIG. 11 in the case of the configuration of Patent Literature 1; and FIG. 23 is an operation timing chart corresponding to a part of FIG. 12.

EMBODIMENTS

First Embodiment

Figure 1:
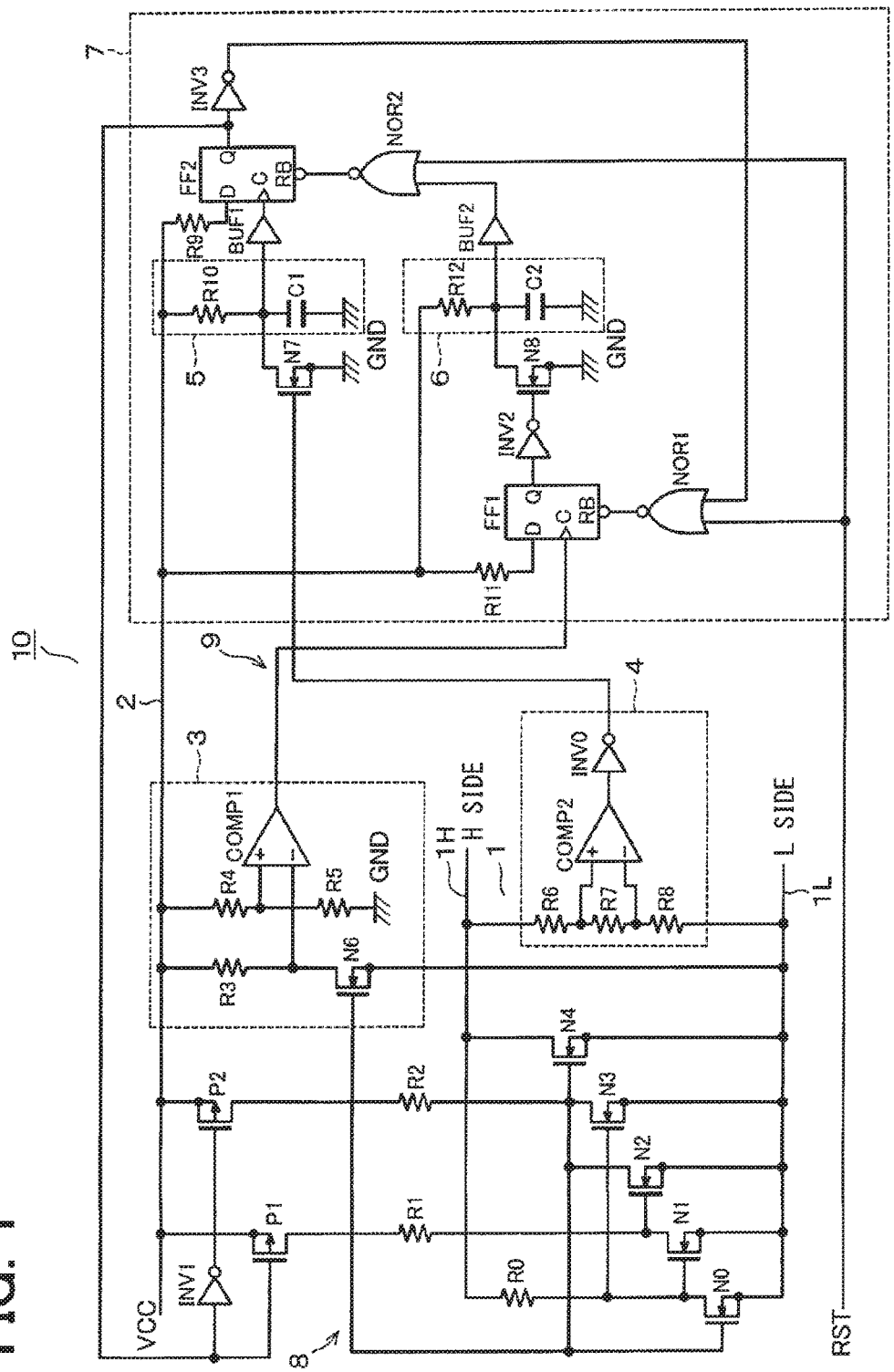
FIG. 1 is a diagram showing a configuration of a ringing suppression circuit according to a first embodiment.

As shown in FIG. 1, a communication bus 1 corresponding to a transmission line includes a high potential side signal line 1H and a low potential side signal line 1L, and the low potential side signal line 1L is connected with sources of five N-channel MOSFETs N0 to N4. A drain of the FET N4 which is a inter-line switching element is connected to the high potential side signal line 1H. A drain of the FET_N0 is connected to the high potential side signal line 1H through a resistance element R0 and also connected to gates of the FETs N1 and N3. The FETs N0 to N3 correspond to first to fourth switching elements. Incidentally, the source of each FET corresponds to a potential reference side conduction terminal, the drain of the FET corresponds to a non-reference side conduction terminal, and the gate of the FET corresponds to a conduction control terminal.

A power supply line 2 to which a power supply VCC is supplied is connected to sources of P-channel MOSFETs P1 and P2, and a drain of the FET_P1 is connected to the drain of the FET_N1 and the gate of the FET_N2 through a resistance element R1. The FETs P1 and P2 correspond to fifth and sixth switching elements. A drain of the FET_P2 is connected to the gate of the FET_N0, the drains of the FETs N2 and N3, and the gate of the FET_N4 through a resistance element R2.

A series circuit of a resistance element R3 and an N-channel MOSFET_N6 is connected between the power supply line 2 and the low potential side signal line 1L, and a gate of the FET_N6 is connected to the gate of the FET_N0. Further, a series circuit of resistance elements R4 and R5 is connected between the power supply line 2 and the ground, and a common connection point of those resistance elements is connected to a non-inverting input terminal of a comparator COMP1. An inverting input terminal of the comparator COMP1 is connected to the drain of the FET_N6. The FET_N6 corresponds to a detection switching element.

An output terminal of the comparator COMP1 is connected to a clock terminal C of a D flip-flop FF1 corresponding to a second flip-flop. The resistance elements R3 to R5, the FET_N6, and the comparator COMP1 configure an ON confirmation circuit 3 corresponding to a second set signal output unit.

A series circuit of resistance elements R6 to R8 is connected between the high potential side signal line 1H and the low potential side signal line 1L. A common connection point of the resistance elements R6 and R7 is connected to a non-inverting input terminal of a comparator COMP2, and a common connection point of the resistance elements R7 and R8 is connected to an inverting input terminal of the comparator COMP2. An output terminal of the comparator COMP2 is connected to a gate of the N-channel MOSFET_N7 through an inverter gate INV0. The resistance elements R6 and R7, the comparator COMP2, and the inverter gate INV0 configure a comparator circuit 4 corresponding to a first set signal output unit. In addition, the FET_N7 also corresponds to a first set signal output unit.

A source of the FET_N7 is connected to the ground and a drain of the FET_N7 is connected to a clock terminal C of a D flip-flop FF2 corresponding to a first flip-flop through a buffer BUF1. A series circuit of a resistance element R10 and a capacitor C1 is connected between the power supply line 2 and the ground, and a common connection point between the resistance element R10 and the capacitor C1 is connected to a drain of the FET_N7. The resistance element R10 and the capacitor C1 configure a delay circuit 5 corresponding to a detection mask unit. The input terminals D of the D flip-flops FF2 and FF1 are connected to the power supply line 2 through resistance elements R9 and R11, respectively.

An output terminal Q of the D flip-flop FF1 is connected to a gate of an N-channel MOSFET_N8 through an inverter gate INV2. A source of the FET_N8 is connected to the ground and a drain of the FET_N8 is connected to one of input terminals of a NOR gate NOR2 through the buffer BUF2. A series circuit of a resistance element R12 and a capacitor C2 is connected between the power supply line 2 and the ground, and a common connection point between the resistance element R12 and the capacitor C2 is connected to a drain of the FET_N8. The resistance element R12 and the capacitor C2 configure a delay circuit 6. A high active reset signal RST is supplied to the other input terminal of the NOR gate NOR2, and an output terminal of the NOR gate NOR2 is connected to a negative logic reset terminal RB of the D flip-flop FF2.

An output terminal Q of the D flip-flop FF2 is connected to a gate of the FET_P1 and is also connected to a gate of the FET_P2 through an inverter gate INV1. Further, the output terminal Q of the D flip-flop FF2 is connected to one input terminal of the NOR gate NOR1 through an inverter gate INV3. A reset signal RST is supplied to the other input terminal of the NOR gate NOR1, and an output terminal of the NOR gate NOR1 is connected to a negative logic reset terminal RB of the D flip-flop FF1.

In the configuration described above, the delay circuits 5 and 6, the D flip-flops FF1 and FF2, and peripheral circuits of those components configure an ON state holding circuit 7. Further, the FET_N0 to N5, P1 and P2 as well as the inverter gate INV1 and the resistance element R0 configure an ON setting unit 8. Furthermore, the configuration described above except for the FET_N4 configures a control unit 9, and a ringing suppression circuit 10 is configured by the FET_N4 and the control unit 9.

Next, the operation of the present embodiment will be described. In the following description, it is assumed that the present embodiment is applied to the CAN described above, the low level of the differential signal is referred to as "recessive", and the high level of the differential signal is referred to as "dominant".

<Initial State; Recessive>

Figure 2:
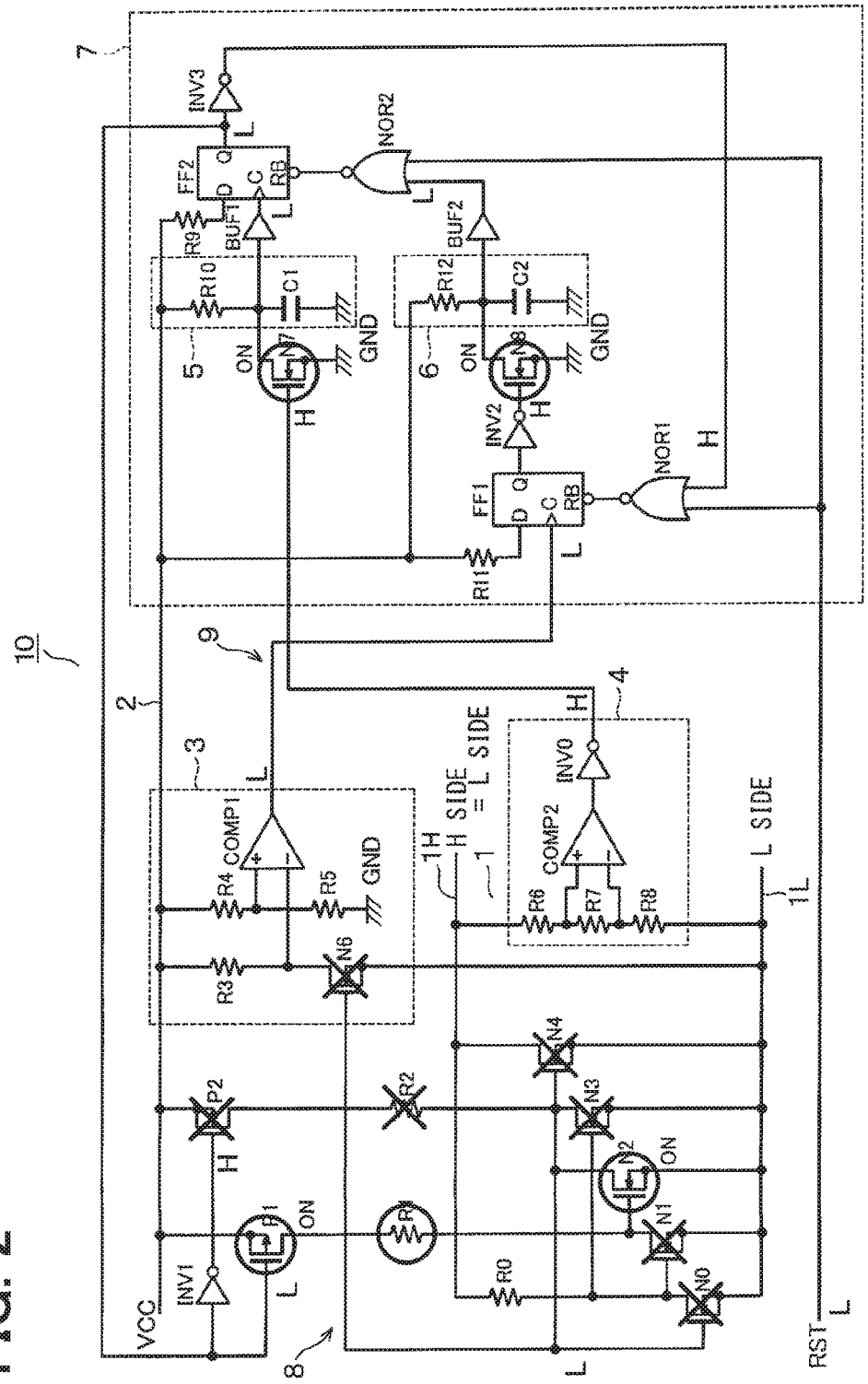
FIG. 2 is a transition diagram of an operation state (No. 1)

As shown in FIG. 2, all of the D flip-flops FF1 and FF2 are reset when the reset signal RST is made active once in an initial state at the time of power-on. As a result, the FET_P1 is turned on, the FET_P2 is turned off, the FET_N2 is turned on, and the FETs N0, N1, N3, N4, and N6 are turned off. Then, an output signal of the ON confirmation circuit 3 becomes low level. In the figure, circles indicate the elements that are in an on state or energized elements, and X indicates the elements that are in an off state or the elements not energized.

Since the FETs N7 and N 8 are turned on, resetting of the D flip-flop FF2 is canceled. However, since the output signal of the inverter gate INV3 is at the high level, the reset state of the D flip-flop FF1 is maintained. At that time, if the communication bus 1 is in a recessive state not driven by a transmission node, the output signal of the comparator circuit 4 becomes high level. Therefore, none of the D flip-flops FF1 and FF2 are triggered, and the reset state is maintained.

<From Recessive to Dominant>

Figure 3:
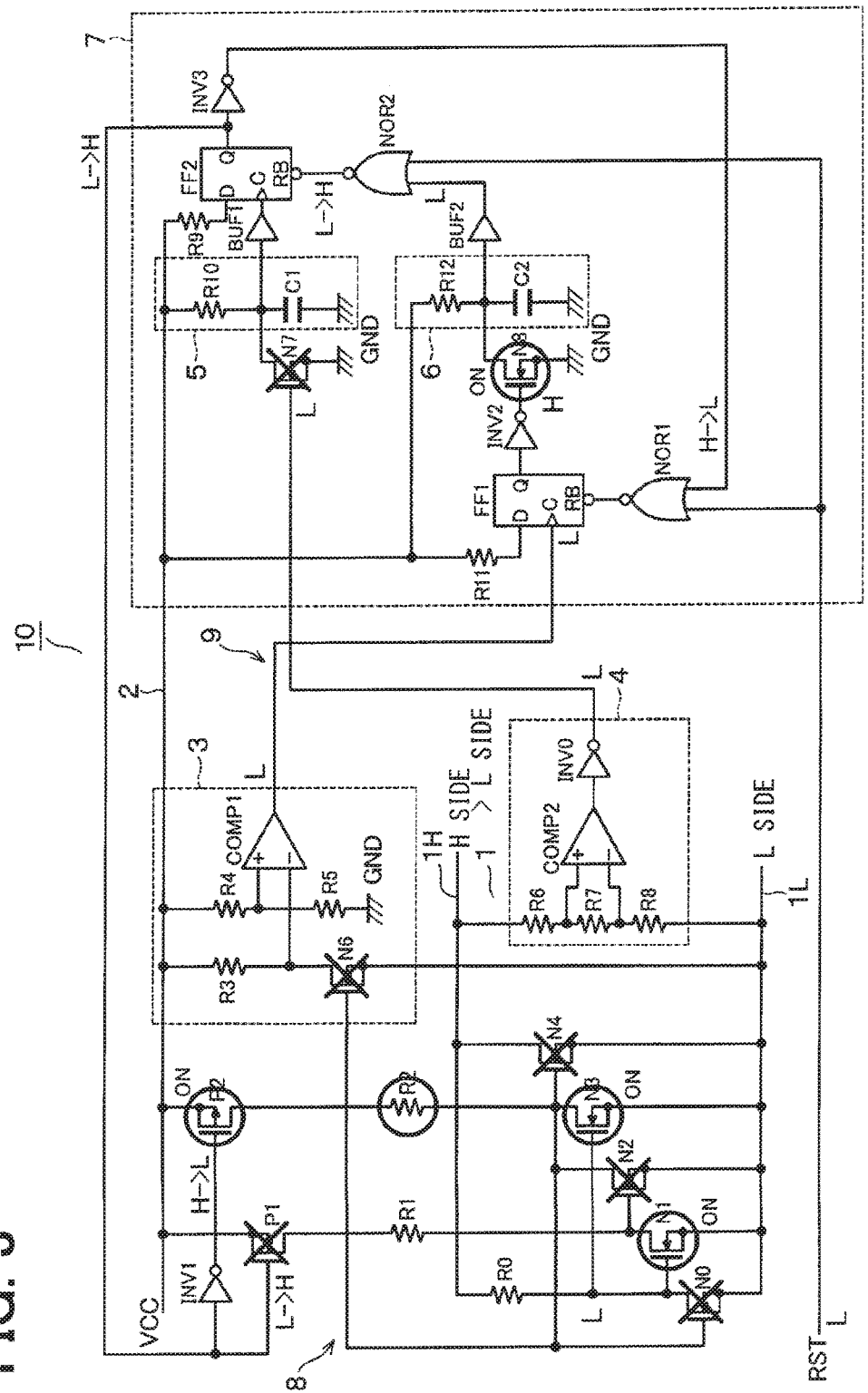
FIG. 3 is a transition diagram of an operation state (No. 2)

Next, as shown in FIG. 3, when the communication bus 1 is driven by the transmission node and the differential signal reaches the dominant level, a current flows in the series circuit of the resistance elements R6 to R8 and the output signal of the comparator circuit 4 becomes low level. Then, since the FET_N7 is turned off, charging of the capacitor C1 is started. Thereafter, when a time corresponding to an RC time constant elapses and a terminal voltage across the capacitor C1 rises to the high level, the D flip-flop FF2 is triggered and the output terminal Q becomes the high level. As a result, the FET_P1 turns off and the FET_P2 turns on so that the FET_N2 turns off and the FETs N1 and N3 turn on. Also, the reset of the D flip-flop FF1 is canceled.

Figure 6:
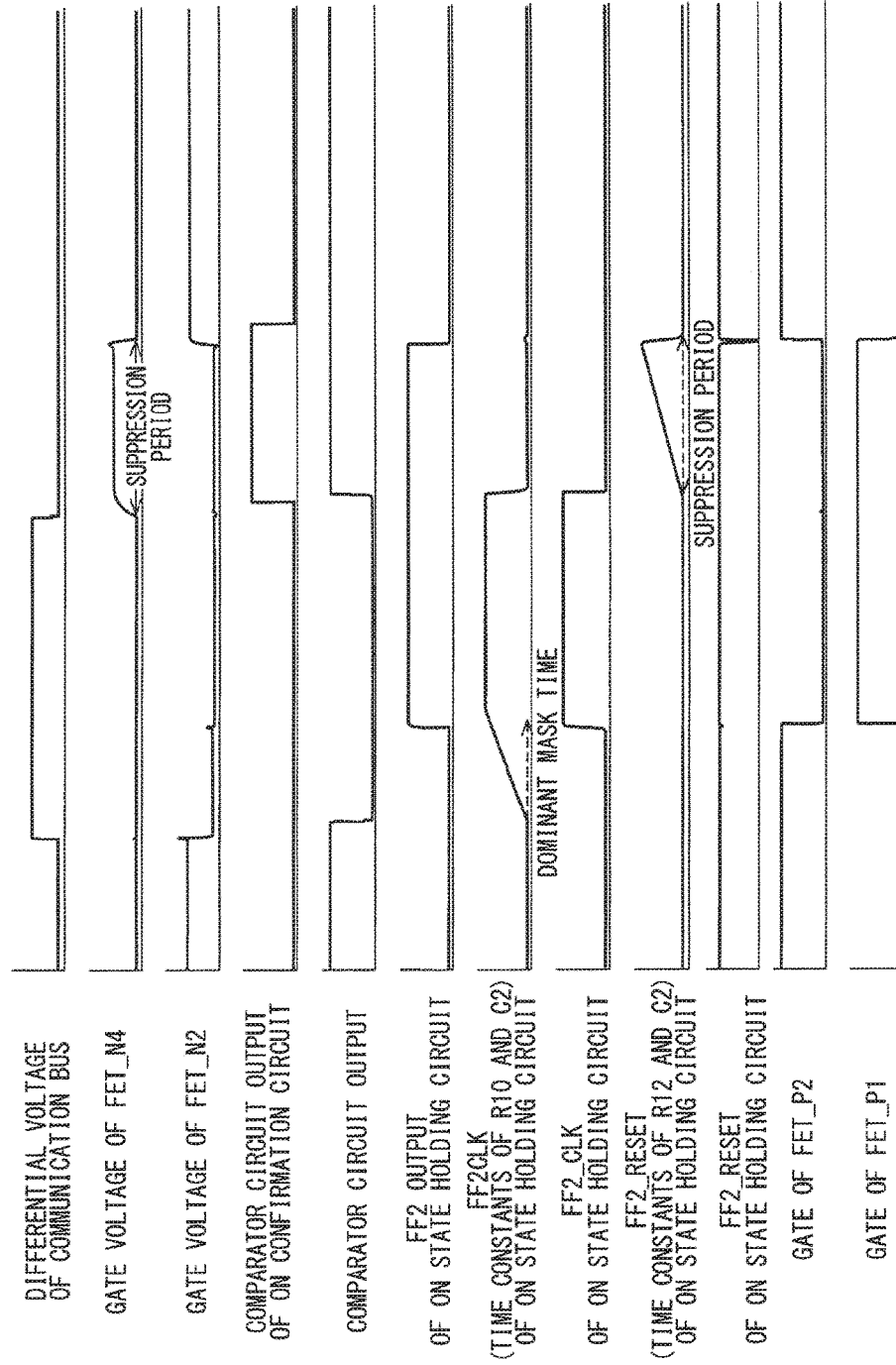
FIG. 6 is an operation timing chart (No. 1)

In other words, when the communication bus 1 changes to a dominant level, the delay circuit 5 acts to mask the detection of the change by the D flip-flop FF1 for a time corresponding to the RC time constant. The above time corresponds to a "dominant mask time" shown in FIG. 6.

<From Dominant to Recessive (Suppression Operation Start)>

Figure 4:
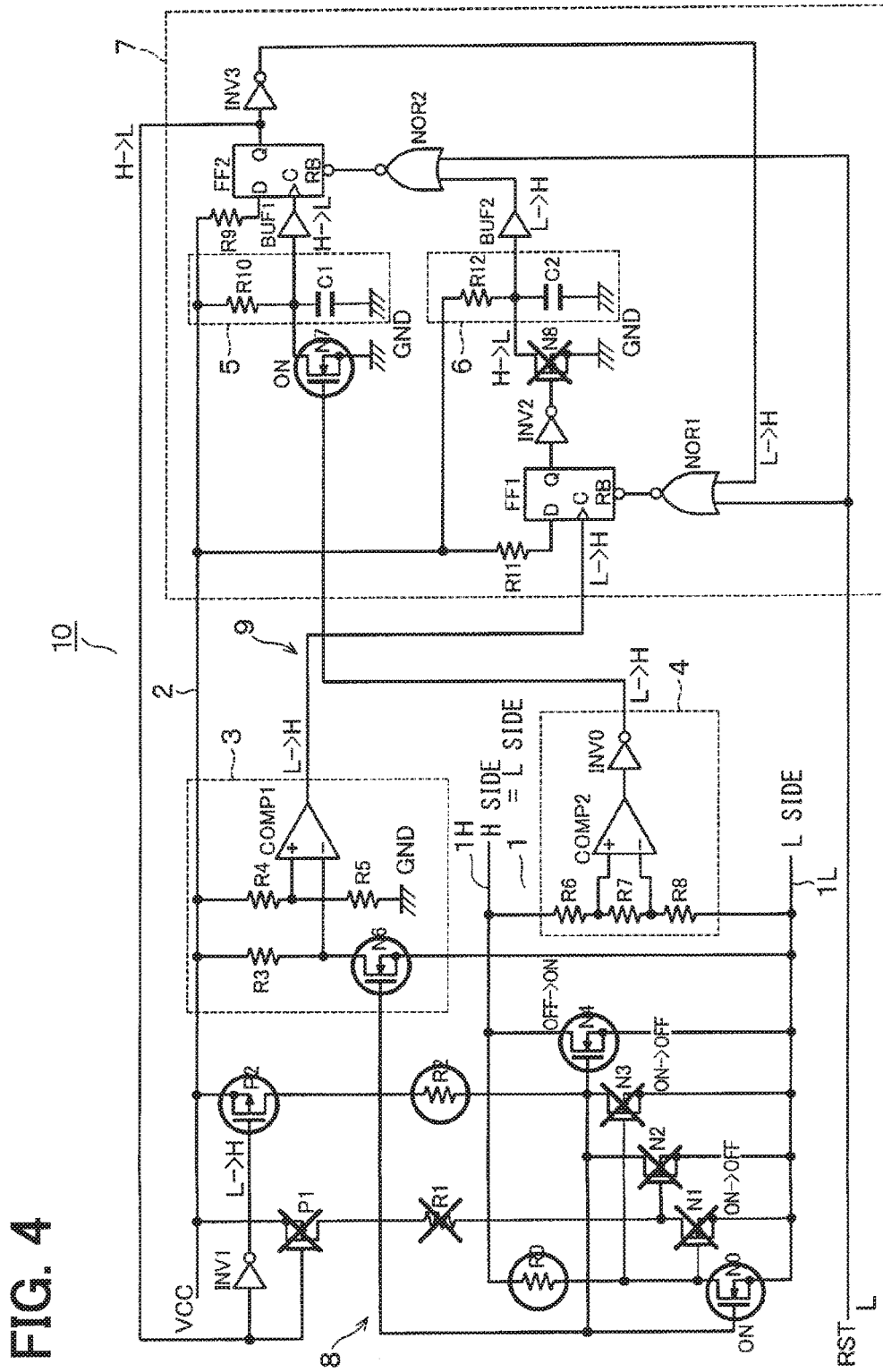
FIG. 4 is a transition diagram of an operation state (No. 3)

Next, as shown in FIG. 4, when the transmission node stops the drive of the communication bus 1 and the differential signal returns to the recessive level, the gates of the FETs N1 and N 3 turn to the low level, and the FETs N1 and N3 turn off. At that time, since the FET_P2 is on, the gates of the FETs N1, N4 and N6 become high level through the resistance element R2, and those FETs turn on. In other words, when the FET_N4 turns on, as a result of which the impedance of the communication bus 1 decreases, the ringing suppression operation is started. At that time, all of the output signals of the ON confirmation circuit 3 and the comparator circuit 4 become high level. As a result, the D flip-flop FF1 is triggered and the FET_N8 turns off to start the charging of the capacitor C2.

<Recessive (Suppression Operation Termination)>

Figure 5:
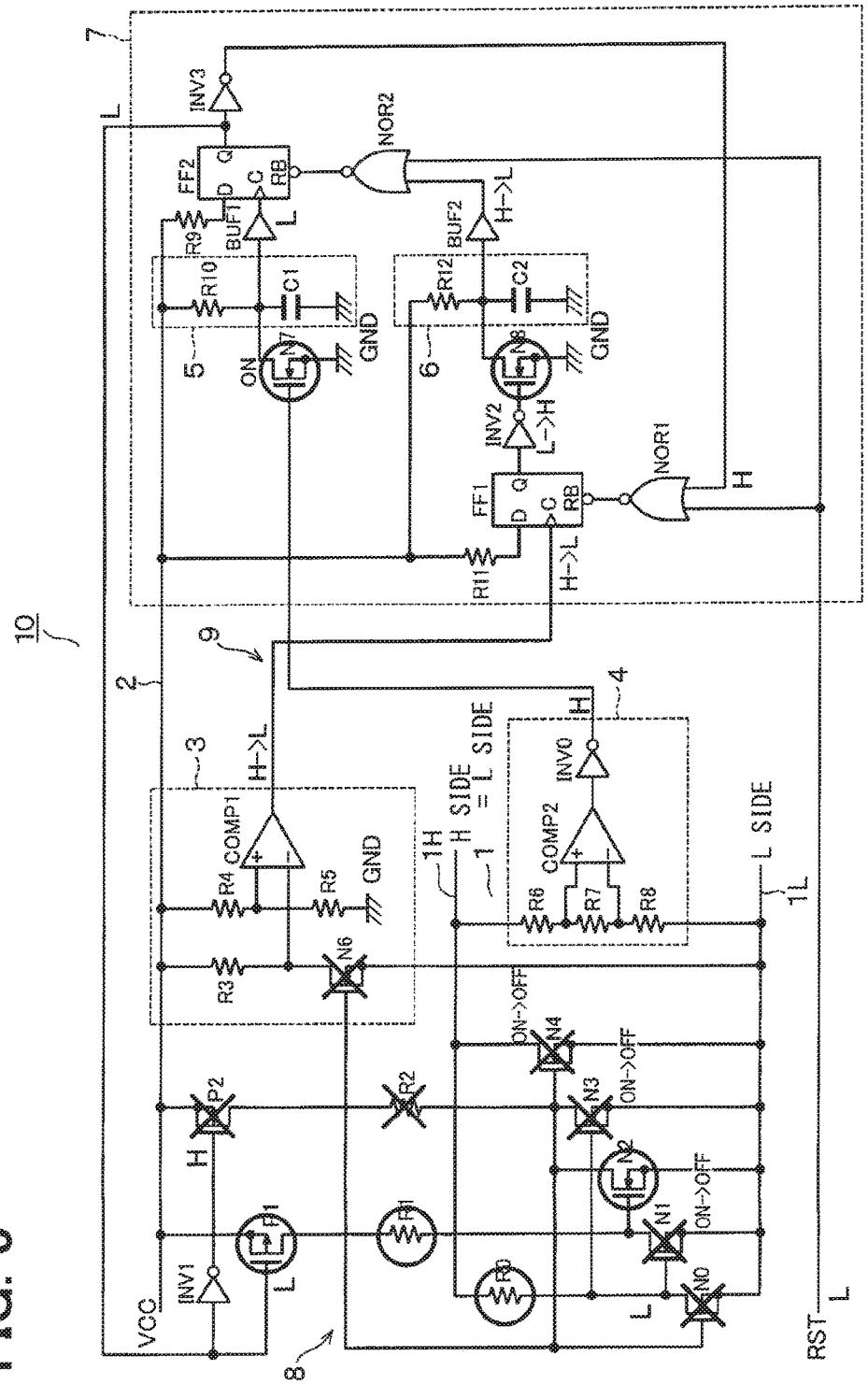
FIG. 5 is a transition diagram of an operation state (No. 4)

Thereafter, when the time corresponding to the RC time constant elapses and the terminal voltage across the capacitor C2 rises to the high level, the D flip-flop FF2 is reset through the NOR gate NOR2. Then, as shown in FIG. 5, the output terminal Q turns to the low level, the FET_P1 turns on and the FET_P2 turns off so that the ringing suppression circuit returns to the same state as the initial state shown in FIG. 2, and the FET_N4 turns off to stop the ringing suppression operation. In other words, as shown in FIG. 4, when the ringing suppression operation is started from a time when the differential signal changes from the dominant to the recessive, the ringing suppression operation is terminated at a time when the delay time given according to the RC time constant of the delay circuit 6 has elapsed since that time (refer to FIG. 6).

Figure 7:
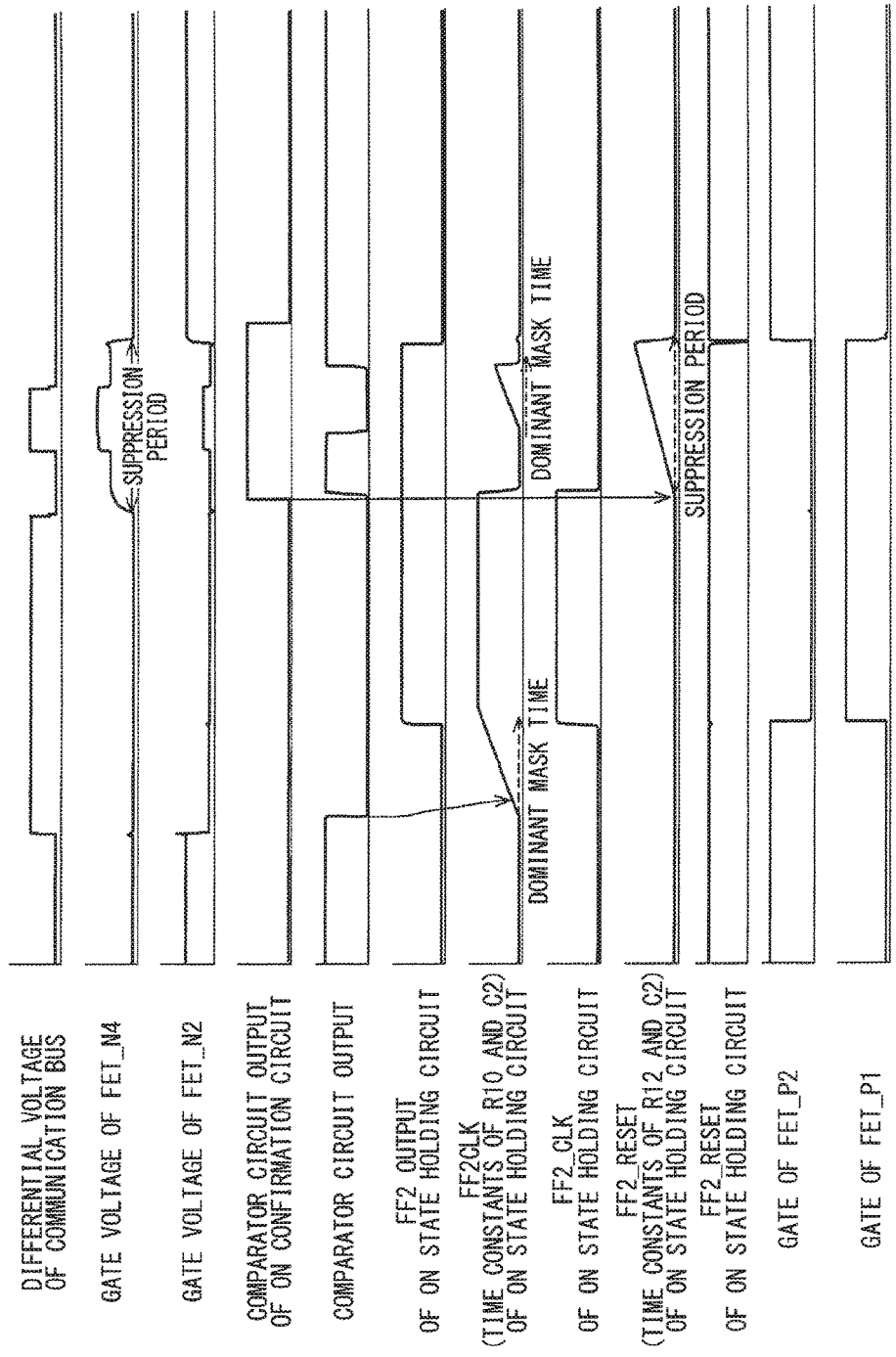
FIG. 7 is an operation timing chart (No. 2)

As shown in FIG. 7, when dominant level noise occurs during execution of the ringing suppression operation, if a noise occurrence period is shorter than a dominant mask period, a level change of the communication bus 1 is not detected by the D flip-flop FF2. Therefore, the ringing suppression operation is executed in the same manner as that in the case shown in FIG. 6.

Figure 8:
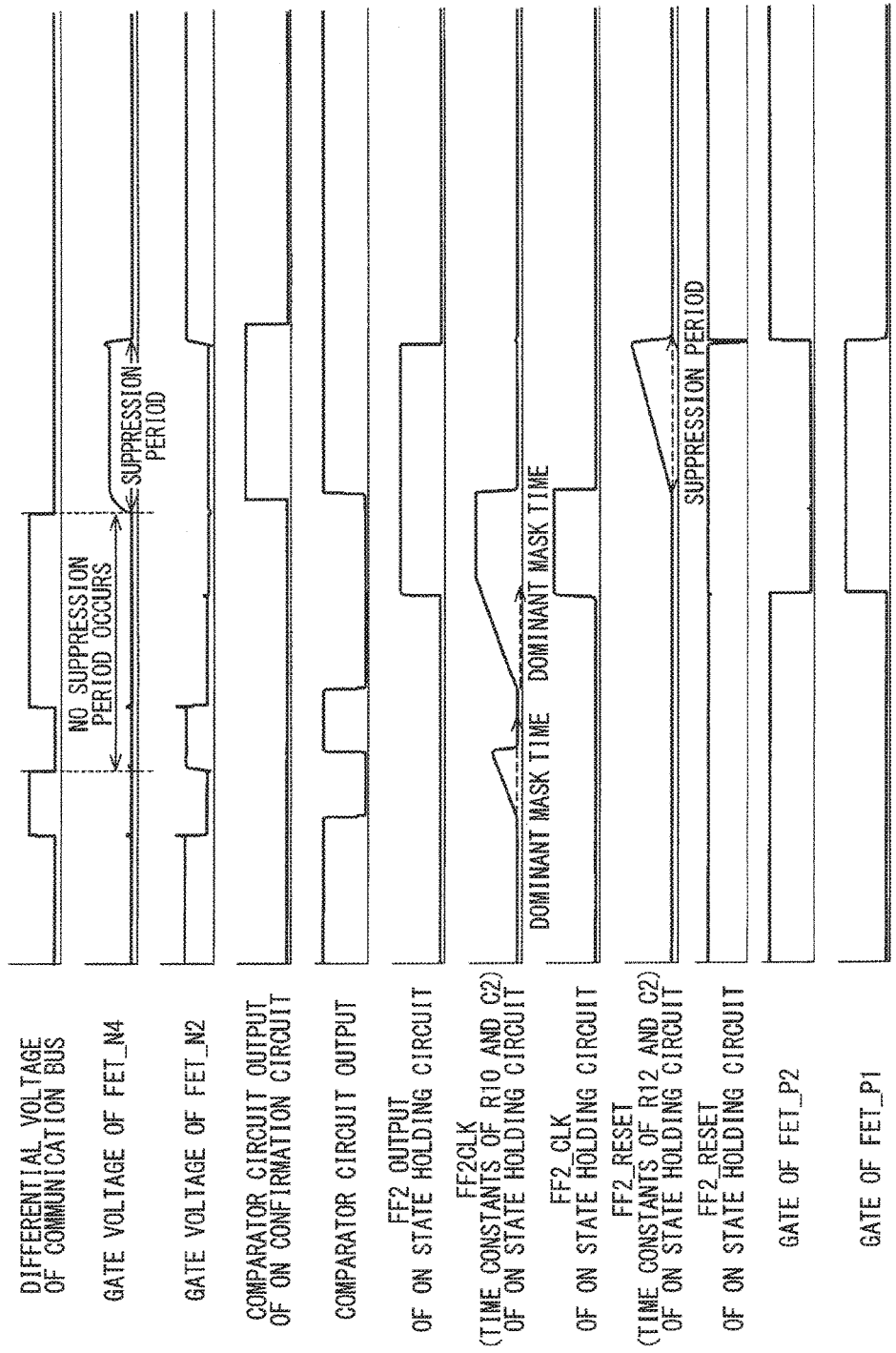
FIG. 8 is an operation timing chart (No. 3)
Figure 9:
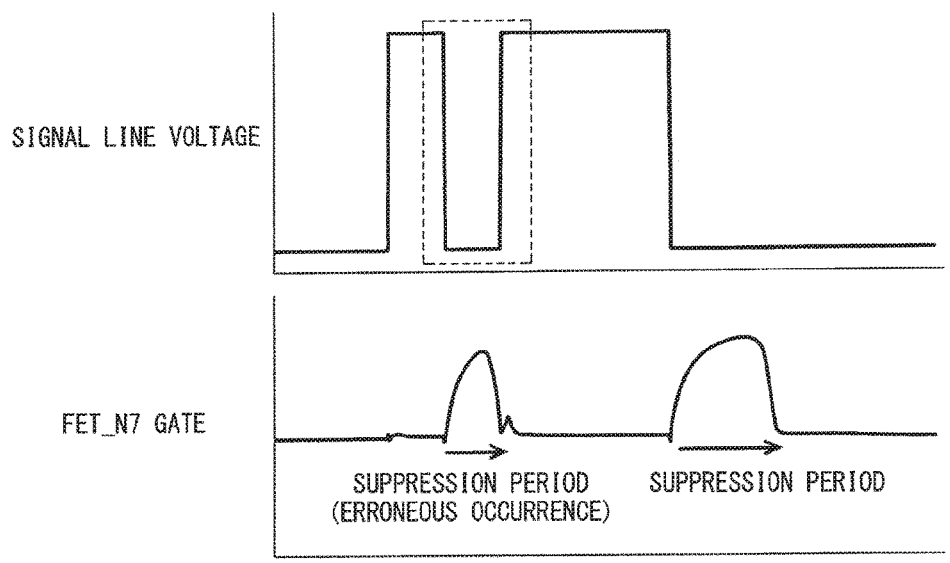
FIG. 9 is an operation timing chart corresponding to a part of FIG. 8 in the case of a configuration of Patent Literature 1.

Also, as shown in FIG. 8, the same applies to a case in which the noise of the recessive level occurs in the dominant state, and as long as a noise occurrence period is shorter than the dominant mask period, the level change of the communication bus 1 is not detected by the D flip-flop FF2. Therefore, in contrast to that shown in FIG. 9 corresponding to the configuration of Patent Literature 1, no extra ringing suppression operation is started.

As described above, according to the present embodiment, when detecting that the differential signal transmitted on the transmission line 1 changes from the dominant to the recessive, the control unit 9 turns on the FET_N4 to fix its state, and then cancels the on state after counting a fixed time by the delay circuit 6. With the configuration described above, once the FET_N4 is turned on according to the level change of the differential signal, the state is fixed. Therefore, even if the level change of the differential signal occurs again thereafter, the FET_N4 is reliably kept in the on state for a fixed period of time without being affected by the level change. As a result, the ringing suppression period can be prevented from being unnecessarily lengthened, thereby being capable of stably performing the signal transmission.

The control unit 9 includes the D flip-flop FF2, the D flip-flop FF1, the delay circuit 6, the comparator circuit 4 and the FET_N7, the ON confirmation circuit 3, and the ON setting unit 8. The D flip-flop FF1 outputs the signal for resetting the D flip-flop FF2 in the set state. The delay circuit 6 is disposed between the output terminal Q of the D flip-flop FF1 and the reset terminal RB of the D flip-flop circuit FF2. The comparator circuit 4 and the FET_N7 output the signal for setting the D flip-flop FF2 upon detection of the change of the differential signal from the recessive to the dominant. The ON confirmation circuit 3 outputs a signal for setting the D flip-flop FF1 upon detecting that the FET_N4 has turned on. The ON setting unit 8 enables the gate of the FET_N4 to reach the on level when the D flip-flop FF2 is set.

As a result, after the D flip-flop FF2 has been set, when the differential signal changes from the dominant to the recessive, the FET_N4 turns on and the ringing suppression operation is started. At that time, the on state of the FET_N4 is fixed by setting the D flip-flop FF2. Then, when the D flip-flop FF2 is reset, the on state of the FET_N4 is canceled and the ringing suppression operation is stopped. Therefore, a period from the time when the differential signal changes from the dominant to the recessive to the time when the D flip-flop FF2 is reset becomes the ringing suppression period.

Once the D flip-flop FF2 has been set by the output signal of the comparator circuit 4, the D flip-flop FF2 is reset after the delay time in the delay circuit 5 has elapsed. Therefore, even when the level of the differential signal changes during the ringing suppression period, the suppression operation is not affected by the level change of the differential signal, and the suppression period can be kept constant.

Further, the ON confirmation circuit 3 includes the FET_N6 whose drain is connected to the power supply line 2 through the resistance element R3 and whose source and gate are connected to the source and gate of the FET_N4, respectively. The ON setting unit 8 includes the FETs N0 to N3, the FET_P1, and the FET_P2. The FETs N0 to N3 have sources connected to the low potential side signal line 1L. The FET_P1 has a source connected to the power supply line 2, and a drain connected to the drain of the FET_N1 and the gate of the FET_N2 through the resistance element R1. The FET_P2 has a source connected to the power supply line 2 and a drain connected to the drain of the FET_N3 and the gate of the FET_N1 through the resistance element R2.

The gate of FET_N0 is connected to the gate of the FET_N4, the gates of the FETs N1 and N3 are connected to the drain of the FET N0 and to the high potential side signal line 1H through the resistance element R0, and the gate of the FET_N2 is connected to the drain of the FET_N1. When the D flip-flop FF2 is set, the FET_P1 is turned on and the FET_P2 is turned off. As a result, when the D flip-flop FF2 is set, the ON setting unit 8 enables the gate of the FET_N4 to reach the on level, and when the D flip-flop FF2 is reset, the ON setting unit 8 enables the gate of the FET_N4 to reach the off level.

Further, upon detection of the change of the differential signal from the recessive level to the dominant level, the delay circuit 5 delays the set signal of the D flip-flop FF2 output by the comparator circuit 4 through the FET_N7, to thereby mask the detection of the change by the control unit 8 for a certain period of time. With the configuration described above, even if the recessive level noise is superimposed in a state in which the differential signal is at the dominant level and the ringing suppression operation is not started, the control unit 8 does not start the suppression operation at that time. As a result, the dominant signal waveform which has been normally transmitted can be prevented from being distorted due to the influence of noise.

Second Embodiment

Figure 10:
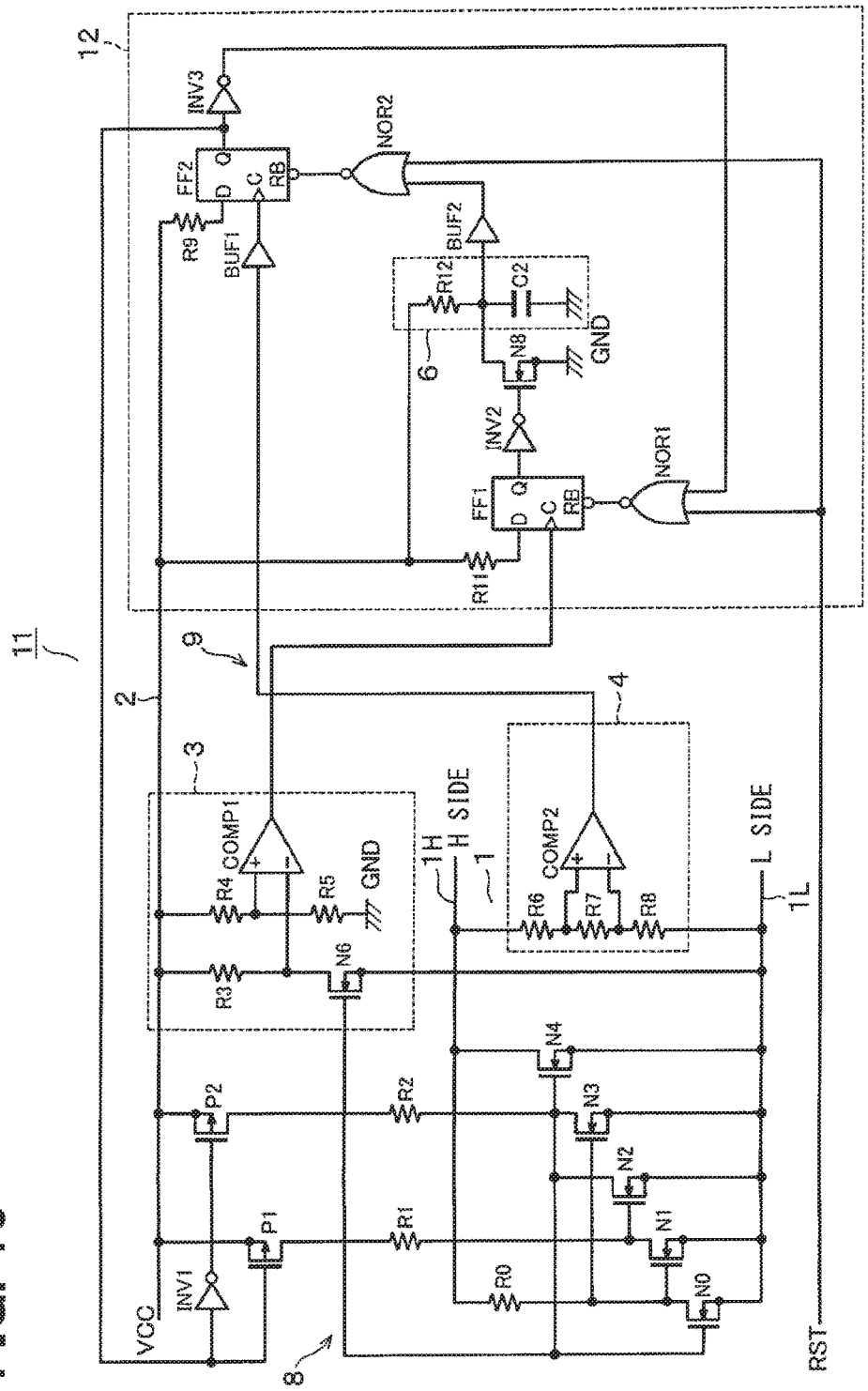
FIG. 10 is a diagram showing a configuration of a ringing suppression circuit according to a second embodiment.
Figure 11:
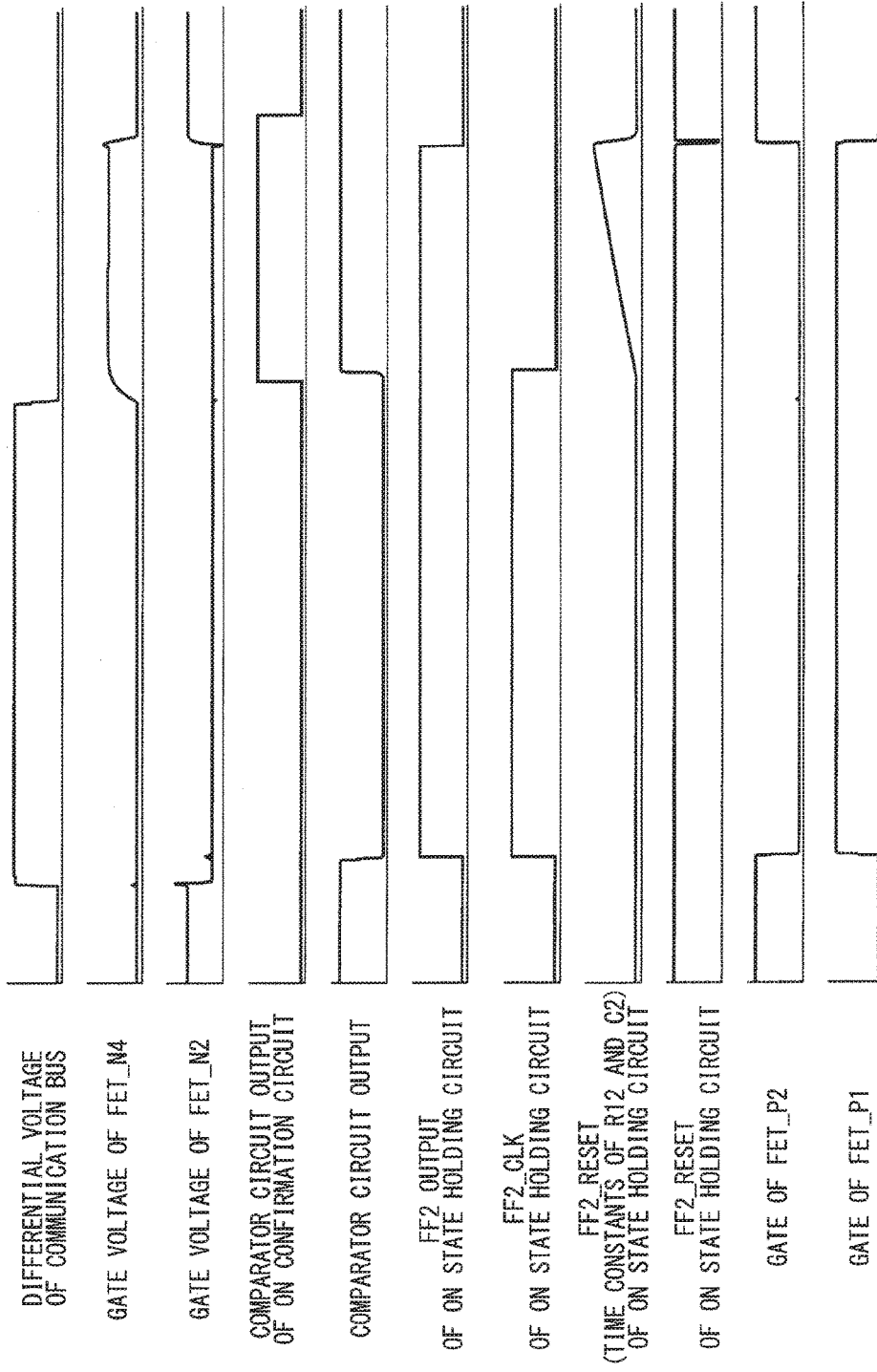
FIG. 11 is an operation timing chart (No. 1)
Figure 12:
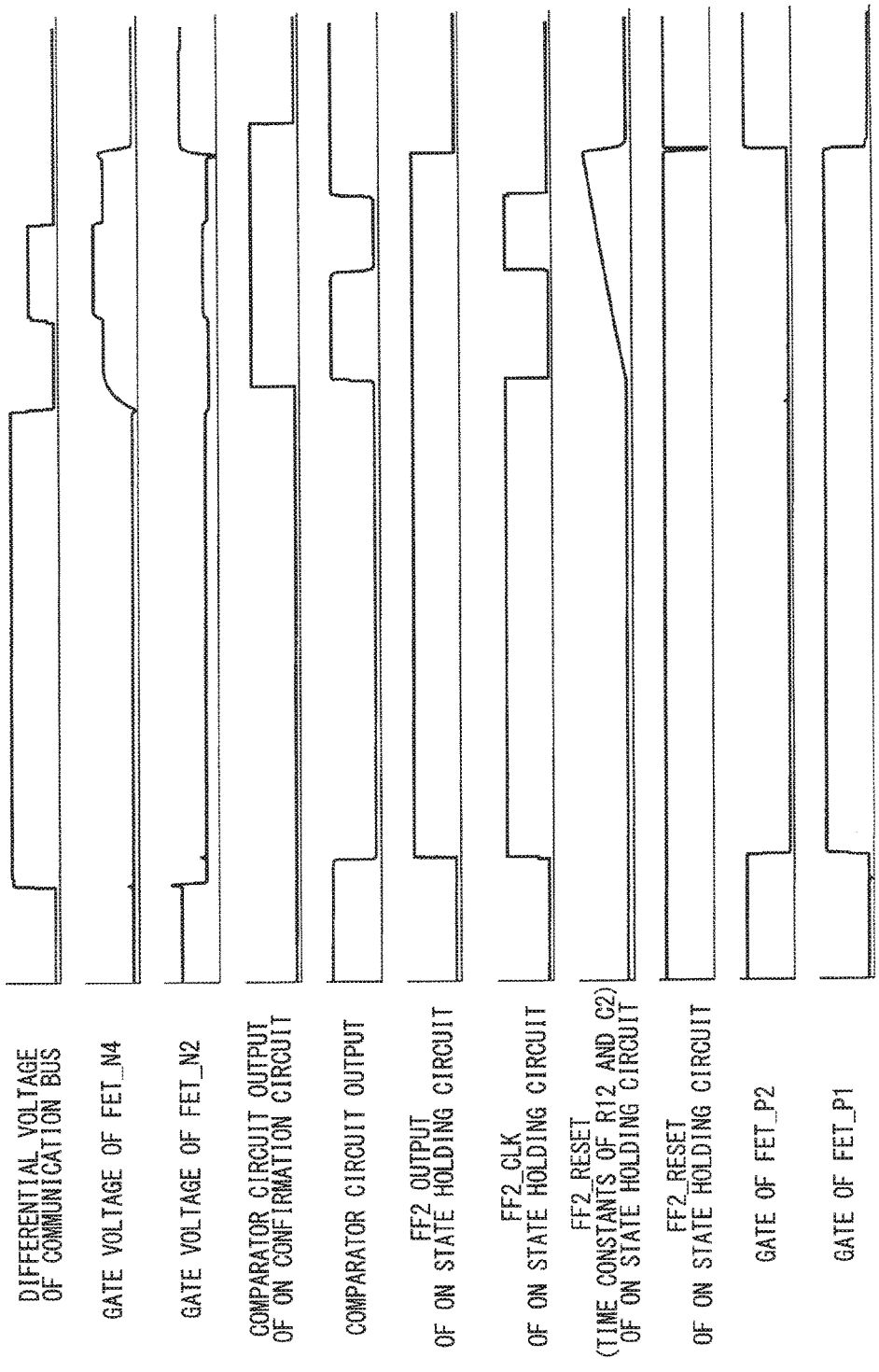
FIG. 12 is an operation timing chart (No. 2)

Hereinafter, the same reference signs will be assigned to the same portions as in the first embodiment. The same portions will not be described, and different portions will be described. As shown in FIG. 10, a ringing suppression circuit 11 according to a second embodiment is provided with an ON state holding circuit 12 in which the FET_N7 and the delay circuit 5 are removed from the ON state holding circuit 7. In this case, as shown in FIG. 11, the normal ringing suppression operation is performed in the same manner as in the first embodiment. In addition, as shown in FIG. 12, also when the dominant level noise occurs in a recessive state, the ringing suppression operation is performed as in the first embodiment.

Figure 13:
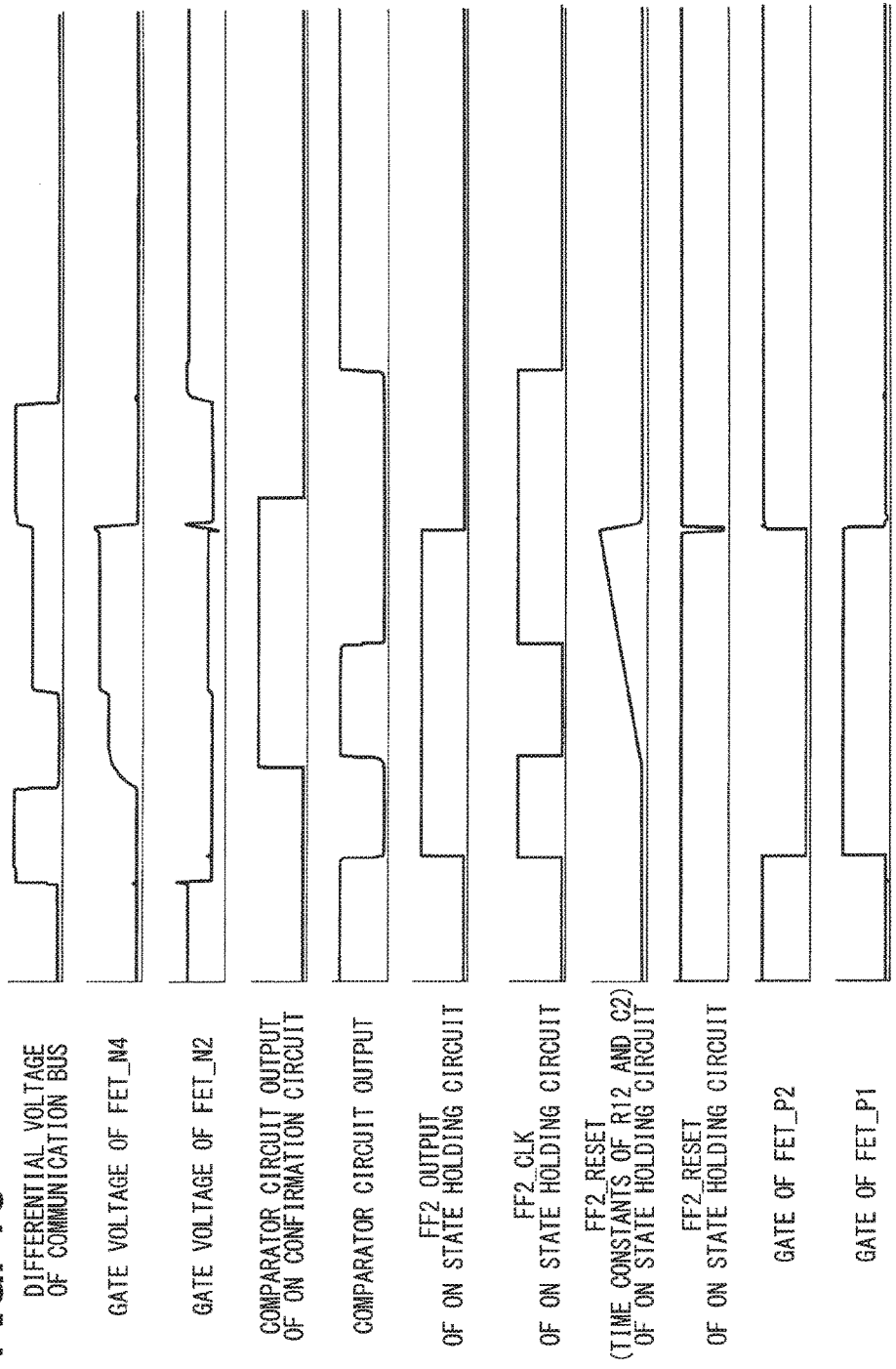
FIG. 13 is an operation timing chart (No. 3)

However, as shown in FIG. 13, when a recessive level noise occurs in the dominant state, the ringing suppression operation is started according to the level change, and thus the dominant signal waveform is distorted.

Third and Fourth Embodiments

Figure 14:
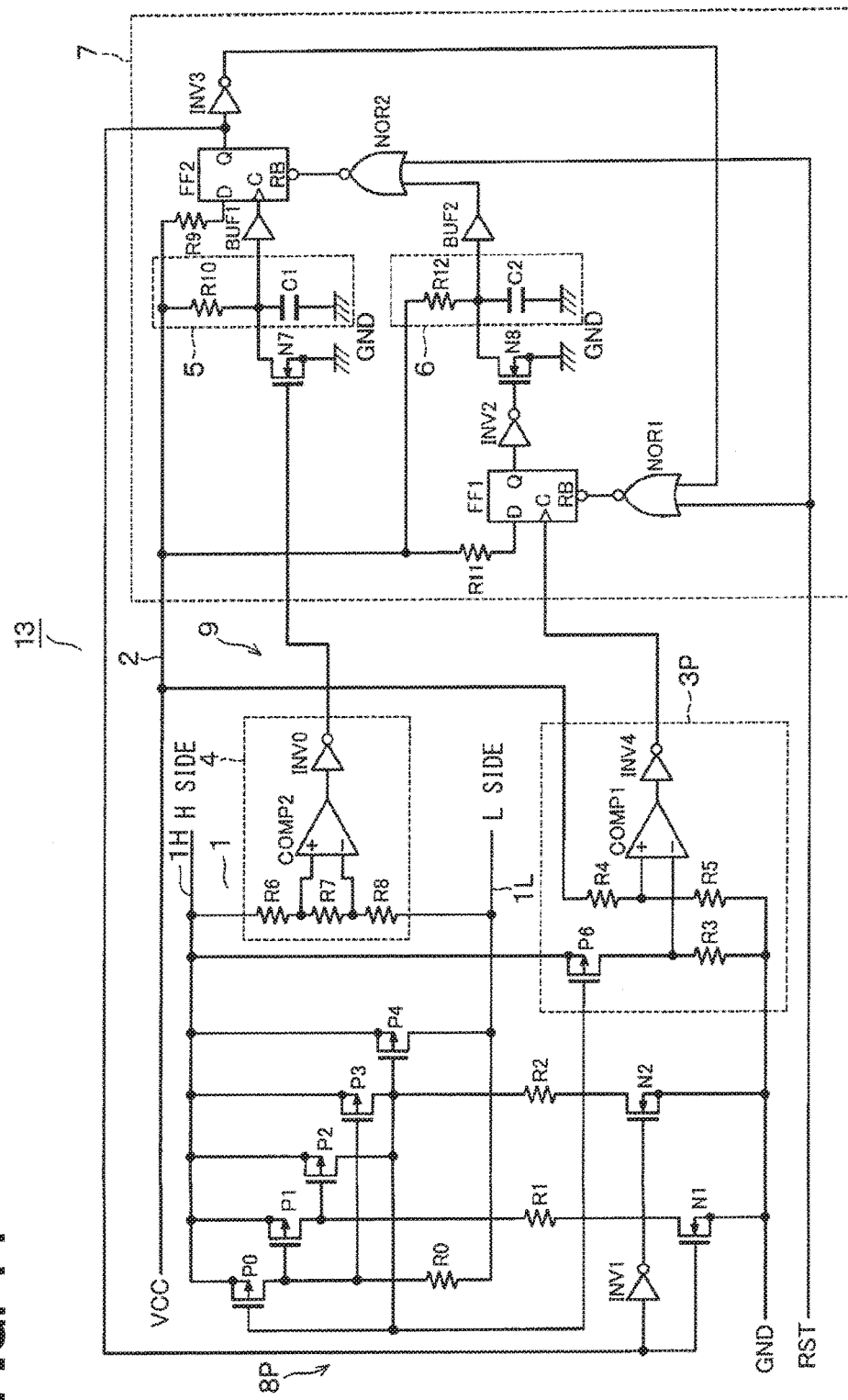
FIG. 14 is a diagram showing a configuration of a ringing suppression circuit according to a third embodiment.

As shown in FIG. 14, a ringing suppression circuit 13 according to a third embodiment has a configuration in which the FETs N0 to N4 are replaced with P-channel MOSFETs P0 to P4. Sources of the FETs P0 to F4 are connected to a high potential side signal line 1H. A drain of the FET_P4 which is a inter-line switching element is connected to a low potential side signal line 1L. Gates of the FETs P0 and P4 are connected to drains of the FETs P2 and P3 and also connected to a gate of a P-channel MOSFET_P6 configuring a comparator circuit 3P.

A drain of the FET_P0 is connected to the low potential side signal line 1L through a resistance element R0 and also connected to gates of the FETs P1 and P3. The FETs P1 and P2 that configure the ON setting unit 8 according to the first embodiment are replaced by N-channel MOSFETs N1 and N2 to configure an ON setting unit 8P. Sources of the FETs N1 and N2 are connected to the ground. A drain of the FET_N1 is connected to a drain of FET_P1 and a gate of the FET_P2 through a resistance element R1, and a drain of the FET_N2 is connected to a gate of the FET_P4 through a resistance element R2.

As a result, the comparator circuit 3 is replaced with the comparator circuit 3P as described above. A series circuit of the FET_P6 and the resistance element R3 is connected between the signal line 1H and the ground, and a common connection point between the FET_P6 and the resistance element R3 is connected to an inverting input terminal of a comparator COMP1. A common connection point of the resistance elements R4 and R5 is connected to a non-inverting input terminal of the comparator COMP1. An output terminal of the comparator COMP1 is connected to a clock terminal C of the D flip-flop FF1 through an inverter gate INV 4. Also in the case of the third embodiment configured as described above, the same advantages as in the first embodiment can be obtained.

Figure 15:
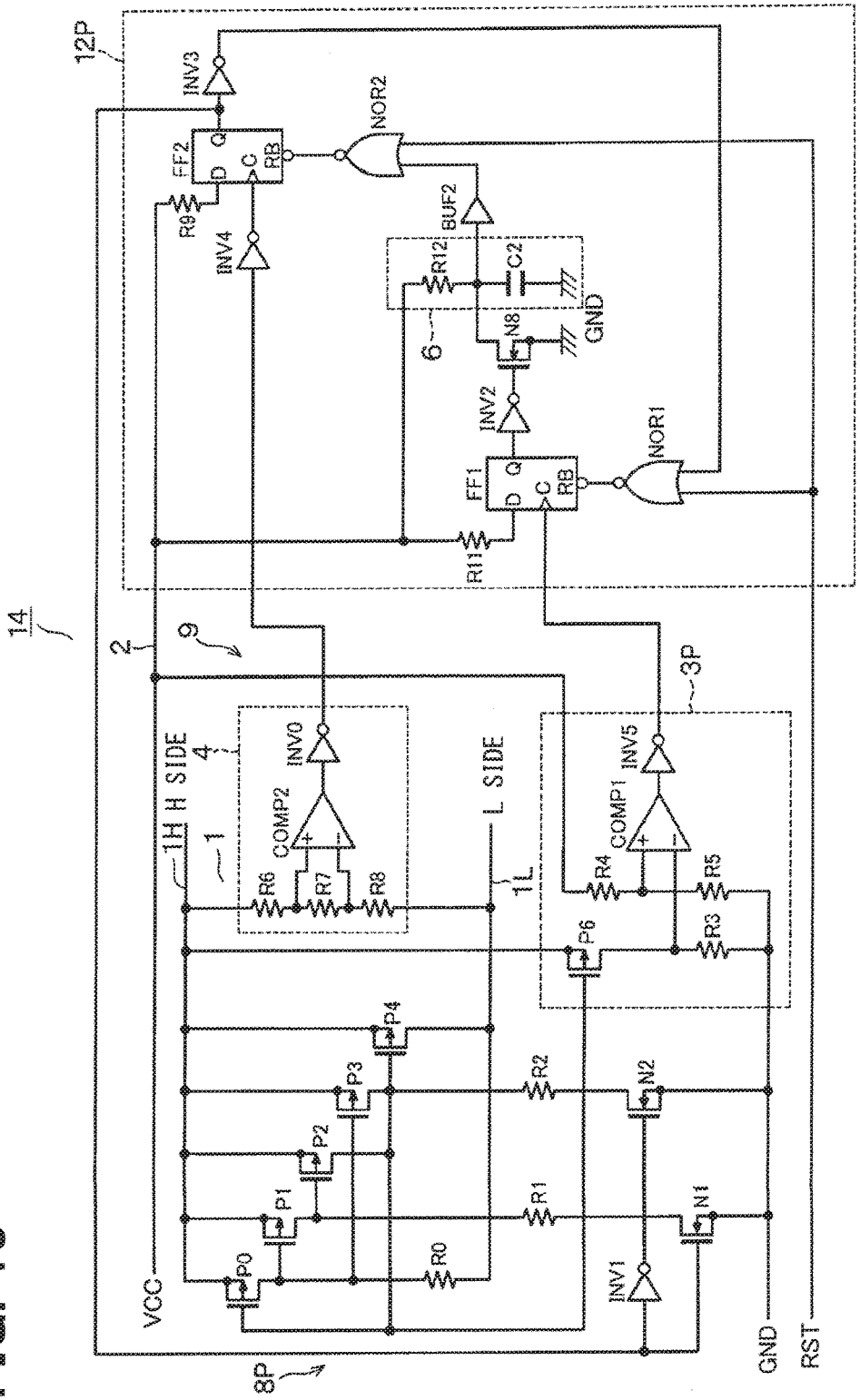
FIG. 15 is a diagram showing a configuration of a ringing suppression circuit according to a fourth embodiment.

A ringing suppression circuit 14 according to a fourth embodiment shown in FIG. 15 has a configuration in which the ringing suppression circuit 11 according to the second embodiment is changed such that the FETs N0 to N4 are replaced with P-channel MOSFETs P0 to P4 as in the third embodiment, and includes an ON state holding circuit 12P in which the FET_N7 and the delay circuit 5 are deleted from the ON state holding circuit 7. In that case, an inverter gate INV4 is inserted between an output terminal of a comparator circuit 4 and a clock terminal C of a D flip-flop FF2, but if an inverter gate INV0 of the comparator circuit 4 is deleted, the inverter gate INV 4 is also unnecessary. Incidentally, the inverter gate INV 4 according to the third embodiment corresponds to an inverter gate INV5. According to the fourth embodiment configured as described above, the same advantages as those in the second embodiment can be obtained.

Fifth Embodiment

Figure 16:
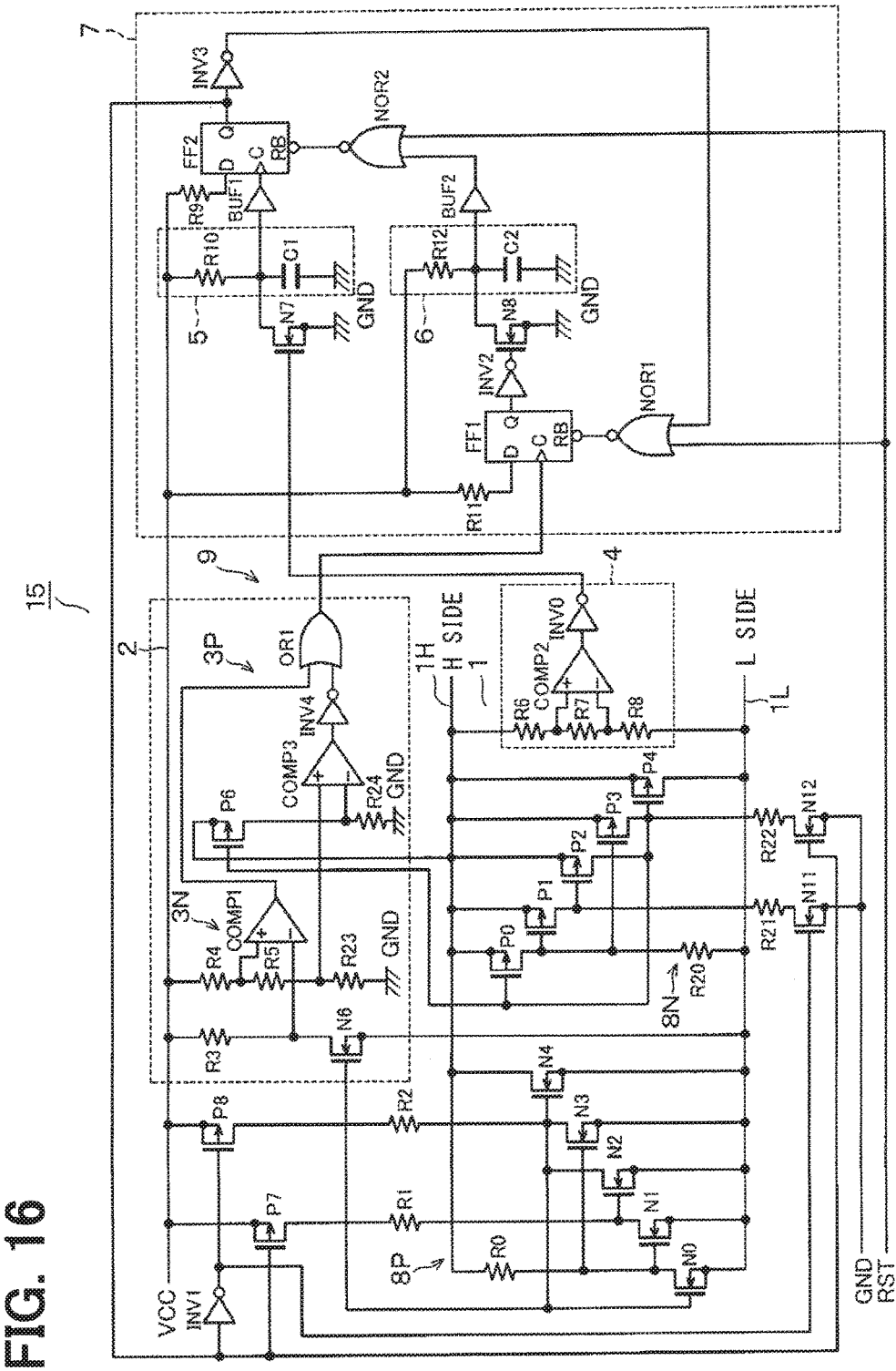
FIG. 16 is a diagram showing a configuration of a ringing suppression circuit according to a fifth embodiment.

A ringing suppression circuit 15 according to a fifth embodiment shown in FIG. 16 is a combination of the first embodiment and the fourth embodiment, and the ON setting unit 8 of the first embodiment is set as an ON setting unit 8N, and an ON setting unit 8P is added. In order to avoid duplication of reference numerals, the FETs N1 and N2 in the fourth embodiment are referred to as FETs N11 and N12, and the resistance elements R0 to R3 in the fourth embodiment are referred to as R20 to R22 and R24.

In an ON confirmation circuit 3N mainly configured by a comparator COMP1, a resistance element R23 is inserted between a resistance element R5 and the ground. A common connection point of the resistance elements R5 and R23 is connected to a non-inverting input terminal of a comparator COMP3 configuring the ON confirmation circuit 3P. An output terminal of the comparator COMP1 is connected to one input terminal of an OR gate OR1 and an output terminal of the comparator COMP3 is connected to the other input terminal of the OR gate OR1 through the inverter gate INV4. An output terminal of the OR gate OR1 is connected to a clock terminal C of a D flip-flop FF1. According to the fifth embodiment configured as described above, the same advantages as those in the first and fourth embodiments can be obtained.

Sixth Embodiment

Figure 17:
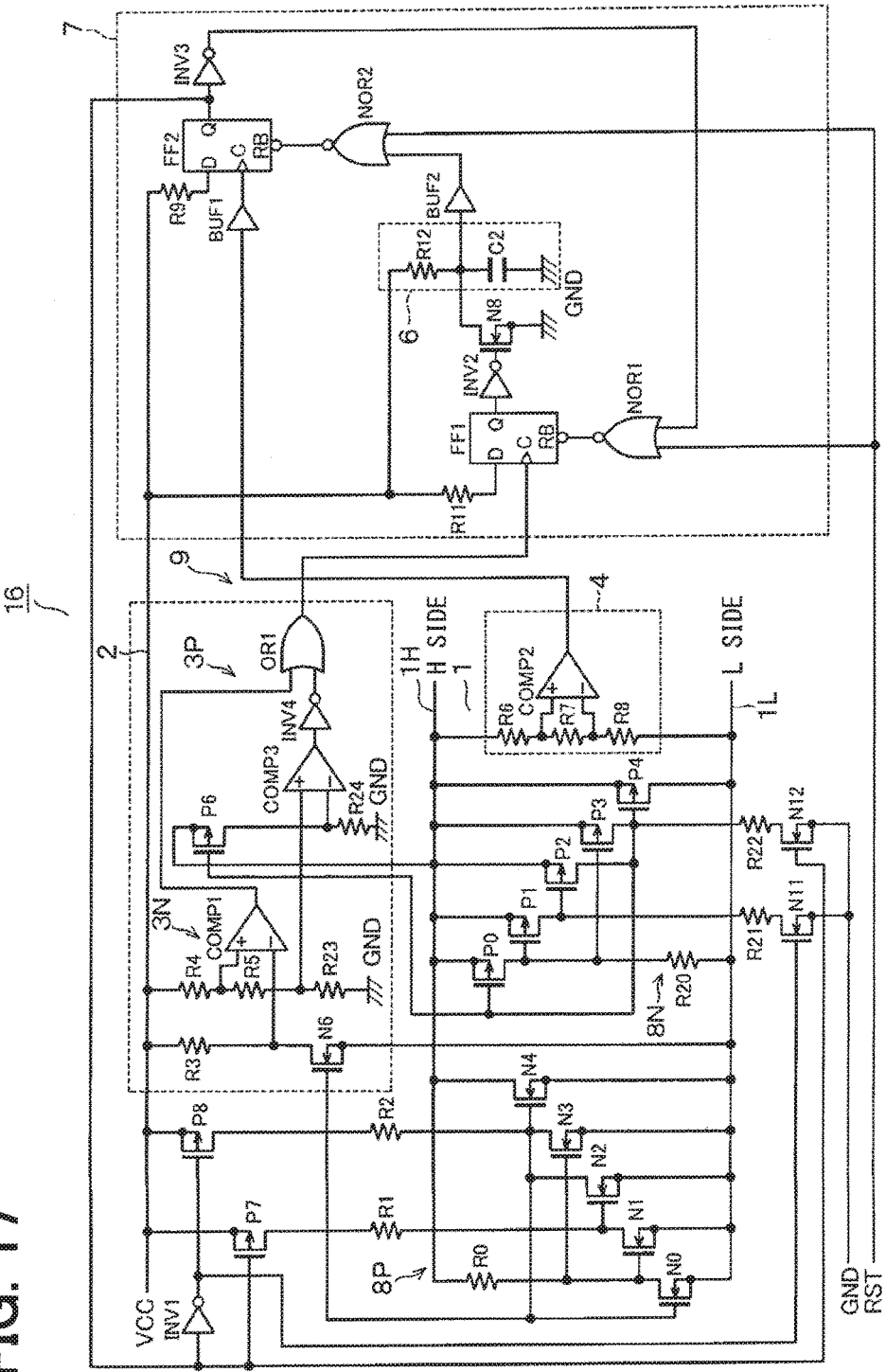
FIG. 17 is a diagram showing a configuration of a ringing suppression circuit according to a sixth embodiment.

A ringing suppression circuit 16 according to a sixth embodiment shown in FIG. 17 has the configuration of the fifth embodiment applied to the configuration of the second embodiment and includes ON setting units 8N and 8P. According to the sixth embodiment configured as described above, the same advantages as those of the second and fifth embodiments can be obtained.

Other Embodiments

The FET_N4 or P4 which is the inter-line switching element may be configured by the elements shown in FIGS.

Figure 18:
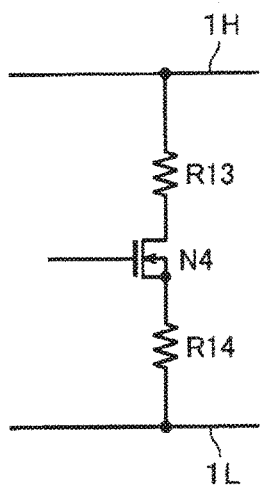
FIG. 18 is a diagram (No. 1) showing another configuration of a inter-line switching element.
Figure 19:
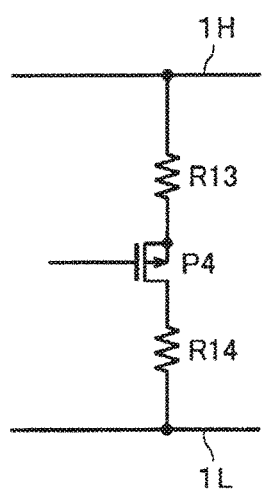
FIG. 19 is a diagram (No. 2) showing another configuration of the inter-line switching element.

18 to 21. FIG. 18 shows a configuration in which a resistance element R13 is inserted between a signal line 1H and a drain of an FET_N4 and a resistance element R14 is inserted between a source of the FET_N4 and the signal line 1L. In FIG. 19, the FET_N4 in FIG. 18 is replaced with an FET_P4.

Figure 20:
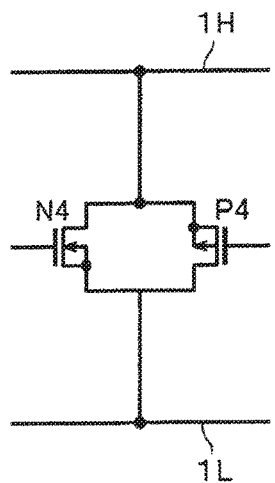
FIG. 20 is a diagram (No. 3) showing another configuration of the inter-line switching element.
Figure 21:
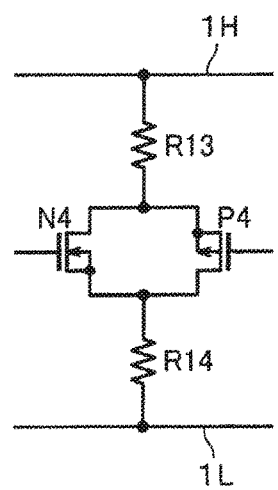
FIG. 21 is a diagram (No. 4) showing another configuration of the inter-line switching element.

FIG. 20 shows a configuration using a so-called analog switch in which the FETs N4 and P4 are connected in parallel to each other. FIG. 21 shows a configuration in which resistance elements R13 and R14 are inserted between the signal lines 1H and 1L and the analog switch as in FIG. 18.

The present disclosure is not limited only to the embodiments described above or illustrated in the drawings, and the embodiments can be modified or expanded in the following manner.

The above configurations may be implemented in combination with each of the embodiments disclosed in Patent Literature 1.

The delay circuits 5 and 6 are not limited to those configured by the resistance elements and the capacitors, and may be configured by a combination with a constant current source, for example.

The resistance elements R1, R2, R21, and R22 may be replaced with constant current sources.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A ringing suppression circuit that is connected to a transmission line for transmitting a differential signal changeable between a high level and a low level in a binary level through a pair of a high potential side signal line and a low potential side signal line, and suppresses ringing that occurs in association with transmission of the differential signal, the ringing suppression circuit comprising:
   an inter-line switching element that is connected to the pair of the high potential side signal line and the low potential side signal line; and
   a control unit that turns on the inter-line switching element and fixes an on state when detecting that the differential signal changes from the high level to the low level, and releases the on state after a predetermined time is measured and elapsed, wherein:
   the control unit includes:
      a first flip-flop that is reset in an initial state;
      a second flip-flop that is reset in the initial state and outputs a reset signal for resetting the first flip-flop in a set state;
      a delay circuit that is disposed between an output terminal of the second flip-flop and a reset terminal of the first flip-flop;
      a first set signal output unit that outputs a set signal for setting the first flip-flop when detecting a change of the differential signal from the low level to the high level;
      a second set signal output unit that outputs a set signal for setting the second flip-flop when detecting a turning-on of the inter-line switching element; and
      an on setting unit that enables a conduction control terminal of the inter-line switching element to be in an on level when the first flip-flop is set.

2. The ringing suppression circuit according to claim 1, wherein:
   the second set signal output unit includes a detection switching element (N6, P6) having a non-potential reference side conduction terminal connected to a power supply through a resistance element and having a potential reference side conduction terminal and a conduction control terminal connected to a potential reference side conduction terminal and a conduction control terminal of the inter-line switching element, respectively;
   the on setting unit includes:
      first to fourth switching elements each of which includes a potential reference side conduction terminal connected to the potential reference side conduction terminal of the inter-line switching element;
      a fifth switching element which includes a potential reference side conduction terminal connected to the power supply, and a non-reference side conduction terminal connected to the non-reference side conduction terminal of the second switching element and the conduction control terminal of the third switching element through another resistance element; and
      a sixth switching element which includes a potential reference side conduction terminal connected to the power supply, and a non-reference side conduction terminal connected to the non-reference side conduction terminal of the third switching element and the conduction control terminal of the inter-line switching element through further another resistance element;
   the conduction control terminal of the first switching element is connected to the conduction control terminal of the inter-line switching element;
   the conduction control terminals of the second and fourth switching elements are connected to the non-reference side conduction terminal of the first switching element and connected to the non-reference side conduction terminal of the inter-line switching element through furthermore another resistance element;
   the conduction control terminal of the third switching element is connected to the non-reference side conduction terminal of the second switching element; and
   when the first flip-flop is set, the fifth switching element turns on and the sixth switching element turns off.

3. The ringing suppression circuit according to claim 1, further comprising:
   a detection mask unit that masks a detection of the change by the control unit for a predetermined time interval when the control unit detects that the differential signal changes from the low level to the high level.

4. The ringing suppression circuit according to claim 3, wherein:
   the detection mask unit includes a delay circuit that delays the set signal output from the first set signal output unit to the first flip-flop.

* * * * *